United States Patent
Klipp et al.

(10) Patent No.: US 7,879,395 B2
(45) Date of Patent: Feb. 1, 2011

(54) METHOD OF PREPARING A COATING SOLUTION AND A CORRESPONDING USE OF THE COATING SOLUTION FOR COATING A SUBSTRATE

(75) Inventors: Andreas Klipp, Dresden (DE); Stephan Wege, Dresden (DE); Tobias Mayer-Uhma, Hochkirch (DE); Cornelia Klein, Dresden (DE); Alexander Michaelis, Dresden (DE); Falko Schlenkrich, Tharandt (DE)

(73) Assignee: Qimonda AG, Munich (DE)

( * ) Notice: Subject to any disclaimer, the term of this patent is extended or adjusted under 35 U.S.C. 154(b) by 1142 days.

(21) Appl. No.: 11/582,239

(22) Filed: Oct. 17, 2006

(65) Prior Publication Data
US 2008/0090101 A1 Apr. 17, 2008

(51) Int. Cl.
*B05D 3/12* (2006.01)
(52) U.S. Cl. ............ 427/240; 427/376.2; 427/380; 427/425
(58) Field of Classification Search .......... 427/240, 427/425, 376.2, 380
See application file for complete search history.

(56) References Cited

U.S. PATENT DOCUMENTS 5,699,192 A * 12/1997 Van Dine et al. ............ 359/269
6,337,032 B1 * 1/2002 Chivukula et al. ...... 252/62.9 R

* cited by examiner

*Primary Examiner*—Kirsten C Jolley
(74) *Attorney, Agent, or Firm*—Fay Kaplun & Marcin, LLP

(57) ABSTRACT

A method of preparing a coating solution, comprising the steps of providing a first solution comprising a lower alcohol; a polyethylene glycol; a complexing agent; and water; providing a second solution comprising a higher alcohol; and at least one metal alkoxide, wherein the metal in said at least one metal alkoxide is selected from the group consisting of zirconium, aluminium, titanium, tantalum and yttrium; forming a sol-gel solution by mixing said first and second solutions and thereby hydrolyzing said at least one metal alkoxide to a metal oxide and an alcohol; forming a concentrated solution by removing said lower alcohol and the alcohol resulting from the hydrolysis of said at least one metal alkoxide; and forming a coating solution by adding a medium alcohol to said concentrated solution.

13 Claims, 1 Drawing Sheet

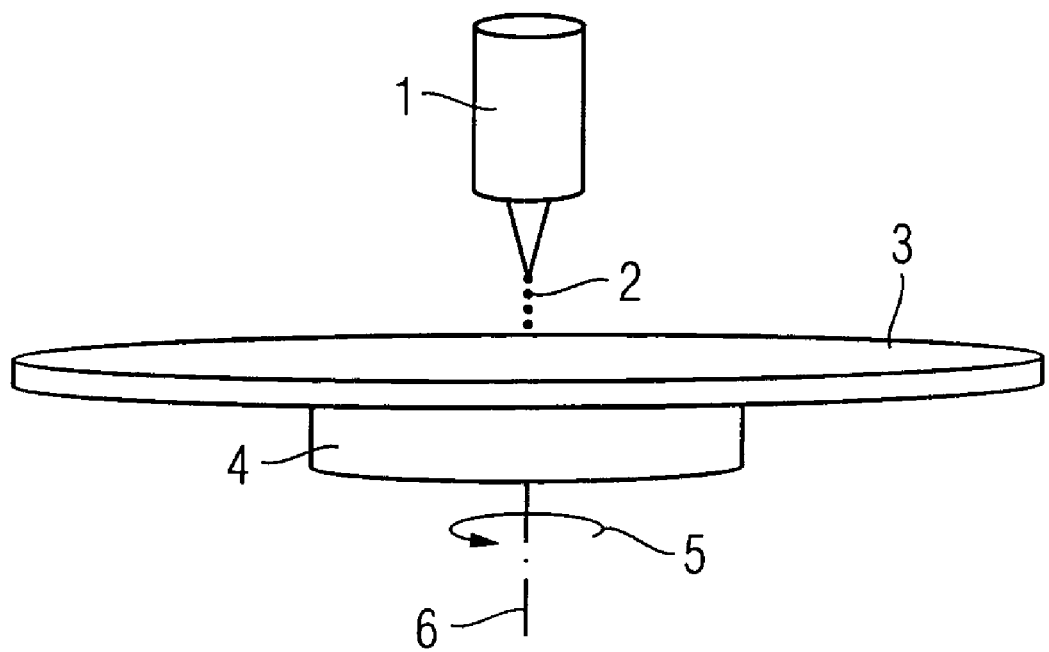

METHOD OF PREPARING A COATING SOLUTION AND A CORRESPONDING USE OF THE COATING SOLUTION FOR COATING A SUBSTRATE

BACKGROUND OF THE INVENTION

1. Field of the Invention

The present invention relates to a method of preparing a coating solution, the coating solution prepared by this method, and corresponding use of the coating solution for coating a substrate and the coated substrate.

2. Description of the Related Art

Spin-coating is a well known technique to coat a substrate. The coating of a substrate by spin-coating methods depends on several parameters. The problem underlying the present invention will now be described referring to the coating of a wafer, especially a 300 mm wafer. However, it is not intended to limit the invention to the coating of a wafer.

Spin-coating of a wafer highly depends on the size of a wafer and the viscosity of the coating solution. For wafers of a size of 100 mm there are well known techniques to coat different coating materials, e.g. a photoresist or a sol-gel solution, onto the wafer. While scaling up the wafer to a 300 mm wafer, many problems arise from the enlarged diameter of the wafer. The differences in the angular speed from the center to the boarder of the wafer are much higher compared to 100 mm wafers. The coating solution to be applied to the wafer thus has to be highly wettable to allow for a constant coating of the substrate. Further, the solution must not dry at the outer rim of the wafer too quickly in order to avoid inhomogeneities in the constitution and thickness of the coating throughout the surface area of the wafer. This is a problem especially in sol-gel solutions containing a high solid content.

Further, the stress within the coating layer becomes a more serious problem as the size of the wafer increases. Current layers of sol-gel coatings introduce a high stress of 300 MPa and higher. By this high stress, the large wafer is bent more than a small one. Moreover, the larger the surface area of the wafer, the greater inhomogeneities regarding the composition and thickness of the layer will develop while coating the wafer.

BRIEF SUMMARY OF THE INVENTION

According to a first aspect of the invention, a method of preparing a coating solution comprises the steps of: providing a first solution comprising a lower alcohol, a polyethylene glycol (PEG), a complexing agent and water; providing a second solution comprising a higher alcohol and at least one metal alkoxide, wherein the metal in said at least one metal alkoxide is selected from the group consisting of zirconium, aluminium, titanium, tantalum and yttrium; forming a sol-gel solution by mixing said first and second solutions and thereby hydrolyzing said at least one metal alkoxide to form a metal oxide and an alcohol; forming a concentrated solution by removing said lower alcohol and the alcohol resulting from the hydrolysis of said at least one metal alkoxide; and forming a coating solution by adding a medium alcohol to said concentrated solution.

According to second aspect of the invention, a coating solution is provided by the above referenced method according to the first aspect of the invention.

According to a third aspect of the invention, a method for coating a substrate comprises the steps of: providing a substrate, and a coating solution prepared by the following steps: providing a first solution comprising a lower alcohol, a poly- ethylene glycol, a complexing agent and water; providing a second solution comprising a higher alcohol and at least one metal alkoxide, wherein the metal in said at least one metal alkoxide is selected from the group consisting of zirconium, aluminium, titanium, tantalum and yttrium; forming a sol-gel solution by mixing said first and second solutions and thereby hydrolyzing said at least one metal alkoxide to form a metal oxide and an alcohol; forming a concentrated solution by removing said lower alcohol and the alcohol resulting from the hydrolysis of said at least one metal alkoxide; and forming a coating solution by adding a medium alcohol to said concentrated solution; spin coating said coating solution onto said substrate to form a coated substrate; forming a dry coating on said substrate by subjecting said coated substrate to a drying step.

According to a fourth aspect of the invention, a coated wafer is prepared by the above referenced method according to a third aspect of the invention.

The basic idea underlying the present invention is to provide a coating solution which is highly able to wet a surface and which solution has a viscosity that allows for the preparation of a film on a large substrate with a high homogeneity and uniformity by spin coating. The coating solution can be applied to the surface of a large substrate by spin-coating to from a thick film on said substrate.

Further, the process can be used to convert a coated film in a rapid thermal anneal process or very quick thermal anneal process into a coating on a substrate having less stress and which is subject to less cracks. Thus, a highly dense coating of a metal oxide results.

By replacing the lower alcohol within the coating solution by a medium alcohol in order to increase the viscosity of the coating solution, and by a specific combination of different chemical substances used to prepare the coating solution, a coating solution can be obtained that can be used to prepare thick coatings on a substrate by spin-coating. The use of a higher alcohol and PEG prevents the quick drying of the coating solution on the surface. If the coating solution dries to quickly, the coating becomes inhomogeneous. This non-uniformity is also referred to as striation and results from non-uniform drying of the coating on the surface.

In addition to the drying step, an anneal of the coating may be performed. The conversion of the layer may thus be a two step heat treatment. The first step of the two step heat treatment is a pre-bake or drying step. In this step, the layer becomes smooth and the stress formation is reduced. The second step is an anneal step with a high heating rate. The anneal step is preformed to reduce the formation of cracks and to densify the layer.

Preferred embodiments are listed in the respective dependent claims.

The following embodiments are embodiments of the first and second aspects of the present invention.

According to an embodiment, the lower alcohol is an alcohol with a low chain length. A low chain length may be a chain length of 4 carbon atoms or less. Preferably, the alcohol may be a $C_1$-$C_3$ alcohol, more preferably ethanol, n-propanol or isopropanol. By using a lower alcohol, a good solubility of the PEG, the complexing agent and the water can be achieved. When an alcohol having more than 6 carbon atoms is used, it is difficult to obtain a solution of all components of the first solution. Additionally, the lower alcohol can easily be removed due to its low boiling point.

According to another embodiment, the higher alcohol is a $C_8$-$C_{20}$ alcohol. Preferably, the higher alcohol $C_9$-$C_{12}$ alcohol, and most preferably, the higher alcohol is a decanol. The alcohol may be an unbranched or branched alcohol. The higher alcohol serves to dissolve the metal alkoxide and to increase the viscosity of the solution. Thus, any higher alcohol may be used that can dissolve the metal alkoxide.

In another embodiment, the medium alcohol is an alcohol having a medium chain length. An alcohol with a medium chain length may be a $C_5$-$C_{10}$ alcohol. The medium alcohol is preferably a pentanol. Again, the alcohol may be an unbranched or branched alcohol.

During the hydrolysis of the metal alkoxide, the water is consumed. The resulting solution thus is less hydrophilic and contains less hydrophilic solvent (water). By replacing the lower alcohol with a higher alcohol, the viscosity of the coating solution can be increased. By using different medium alcohols, the viscosity of the coating solution can be adjusted to the needs of the coating process. The higher the chain length of the medium alcohol, the higher the viscosity of the solution becomes.

Any of the above referenced alcohols may be an n-alcohol, i.e. an un-branched (or linear) alcohol, or a branched alcohol.

The alkoxide used to form the metal alkoxide is preferably a $C_1$-$C_4$ alkoxide. Preferred alkoxides are ethyl alkoxide and propyl alkoxide. The propyl alkoxide may a n-propyl alkoxide or an isopropyl alkoxide. The metal alkoxides may thus be selected from zirconium ethoxide ($Zr(OEt)_4$), zirconium n-propoxide ($Zr(OPr)_4$), zirconium isopropoxide ($Zr(O^iPr)_4$), aluminium ethoxide ($Al(OEt)_3$), aluminium n-propoxide ($Al(OPr)_3$), aluminium isopropoxide ($Al(O^iPr)_3$), titanium ethoxide ($Ti(OEt)_4$), titanium n-propoxide ($Ti(OPr)_4$), titanium isopropoxide ($Ti(O^iPr)_4$), tantalum ethoxide ($Ta(OEt)_5$), and yttrium isopropoxide ($Y(O^iPr)_3$). It is noted that in this context Et stands for an ethyl group (—$CH_2$—$CH_3$), Pr stands for an n-propyl group (—$CH_2$—$CH_2$—$CH_3$) and $^iPr$ stands for an isopropyl group (—CH($CH_3$)$_2$).

The metal alkoxide may be provided in a further solvent. If the metal alkoxide is provided in a further solvent, this solvent is preferably a solvent that can easily be removed while removing the lower alcohol. Accordingly, the further solvent is a lower alcohol, or an alcohol which would result from the hydrolysis of the metal alkoxide, i.e. the alkoxide Preferably, the lower alcohol and the alkoxide are of identical chain length and structure, or differ in their chain length by one carbon atom. If an additional further solvent is used to provide the metal alkoxide, this further solvent also is preferably identical to either the lower alcohol or the alkoxide, or differs in its chain length by one carbon atom. After the hydrolysis, the lower alcohol and the alcohol resulting from the hydrolysis of the metal alkoxide are removed. If both alcohols are identical, or very similar in their structure and chain length, the boiling point of these alcohols is similar and both alcohols can more easily be removed simultaneously.

In an embodiment, the complexing agent or stabilising agent is selected from the group consisting of acetylacetone (AcAc) ($CH_3$—C(O)—$CH_2$—C(O)—$CH_3$) and ethyl acetoacetate (EAA) ($CH_3$—C(O)—$CH_2$—C(O)—O—$CH_2$—$CH_3$).

The terms complexing agent and stabilising agent are used in their equal meaning within this application. The complexing agent stabilises the metal oxide during the sol-gel formation and within the final sol-gel solution. Preferably, acetylacetone may be used to stabilise a zirconium alkoxide. An aluminium alkoxide may be stabilised by ethyl acetoacetate.

In an other embodiment, the polyethylene glycol (PEG) has a molecular weight in the range of 200 to 10.000. Preferably, the molecular weight of the PEG may be in the range of from 400 to 3.000. A specifically preferred PEG is PEG 600. The PEG in the solution ensures a good wettability of a substrate while coating the substrate. Further, the viscosity of the solution is increased by an increased amount of PEG and by a PEG with an increased molecular weight.

In another embodiment, the metal alkoxide may be a mixture of 6-16 mol % of an yttrium alkoxide and 84-94 mol % of a zirconium alkoxide. All above referenced yttrium and zirconium alkoxides may be used. If a mixture of yttrium alkoxide and zirconium alkoxide is used, the final coating resulting from the coating of the coating solution onto a substrate is an yttrium stabilised zirconium alkoxide.

In general, the amount of metal oxide in the coating solution after the hydrolysis of the metal alkoxide may be in the range of from 10% to 22% by weight based on the coating solution. Preferably, the coating solution contains a metal oxide in the range of from 14-18% by weight.

The lower alcohol in the first solution is used to solve the water, the complexing agent and the polyethylene glycol. Accordingly, any amount of lower alcohol may be used to solve these three components. The amount of lower alcohol may be selected in the range of from 3-5 times the molar amount of said at least one metal alkoxide in the second solution. This means that the mixture of the first and the second solution contain 3-5 times the molar amount of lower alcohol in relation to the molar amount of metal alkoxide within this mixture.

The amount of the complexing agent in the first solution is preferably adjusted to an amount of 1-1.5 times the molar amount of said metal alkoxide in said second solution. The molar amount of the complexing agent in the mixture of the first and second solution is thus within the range of from 1 to 1.5 times the molar amount of the metal alkoxide in said mixture.

In another embodiment, the molar amount of said water in said first solution is in the range of from 3-5 times the molar amount of said metal alkoxide in said second solution. The water in the first solution is used in the sol-gel process to hydrolyse the metal alkoxide in order to form a metal oxide. This hydrolysis is the basic reaction that forms the sol-gel process. The molar amount of water in the mixture should be less than, or at most equal to the molar amount of metal alkoxide in the mixture in order not to allow for a complete hydrolysis of the metal alkoxide.

The molar amount of said water in said first solution is thus selected in a range that the molar amount of the water in the mixture of the first and second solution is within the range of from 3-4 times the molar amount of said metal alkoxide for a metal in the oxidation state 4, i.e. a metal having 4 alkoxy groups, e.g. Zr or Ti. More preferably, the molar amount is within a range of from 3-3.5 times the molar amount of said metal alkoxide for a metal in the oxidation state 4, with a value of about 3 being the most preferred.

For a metal in the oxidation state 3, e.g. Al or Y, the molar amount of the water in the mixture of the first and second solution is within the range of from 2-3 times the molar amount of said metal alkoxide. More preferably, the molar amount is within a range of from 2-2.5 times the molar amount of said metal alkoxide for a metal in the oxidation state 3, with a value of about 2 being the most preferred.

For a metal in the oxidation state 5, e.g. Ta, the molar amount of the water in the mixture of the first and second solution is within the range of from 4-5 times the molar amount of said metal alkoxide. More preferably, the molar amount is within a range of from 4-4.5 times the molar amount of said metal alkoxide for a metal in the oxidation state 4, with a value of about 4 being the most preferred.

The amount of PEG in said first solution is adjusted in such a way that the final coating solution contains PEG in a range of from 5% to 10% by weight.

In another embodiment, the amount of said higher alcohol in said second solution is adjusted to result in an amount of said higher alcohol in said final coating solution in the range of from 10% to 20% by weight based on the total weight of the solution.

In a further embodiment, the viscosity of the resulting coating solution is in the range of from 10 to 20 mPa·s, preferably in the range of from 12 to 18 mPa·s, whereas a value of approximately 13.5 mPa·s is the most preferred value.

While removing said lower alcohol and said alcohol resulting from the hydrolysis of the metal alkoxide, a reduced pressure may be applied. This pressure may be less than 500 mbar, preferably less than 250 mbar, and even more preferably less than 150 mbar. If a further solvent is used to provide the metal alkoxide, this further solvent is preferably removed together with the lower alcohol and the alcohol resulting from the hydrolysis. The removal of the alcohol may be done by a distillation.

Additionally or instead of a reduced pressure, an elevated temperature may be applied to the solution while removing said lower alcohol and the alcohol resulting from the hydrolysis. This temperature may be in the range of from 30° to 100° C., preferably in the range of from 50° to 90° C. and most preferably about 80° C.

The removal of said lower alcohol and the alcohol resulting from the hydrolysis of said at least one metal alkoxide is the removal of virtually all of said alcohol. The alcohol which is removed may be the lower alcohol of the first solution, it may result from the hydrolysis of the metal alkoxide, wherein the alkoxide is transferred into an alcohol, or it may be a further solvent, which may be used to solve the metal alkoxide. The alcohol which is removed may be referred to as an alcohol with a chain length of less than $C_4$. In an embodiment, more than 90% of all these alcohols are removed, preferably more than 95% of all these alcohols are removed, and most preferred, more than 97% of all these alcohols are removed.

The following embodiments are embodiments of the third and fourth aspect of the invention.

According to an embodiment, a substrate is a 12 inch (300 mm) wafer or a 12 inch (300 mm) silicon wafer. The wafer may additionally be coated by other coatings, like e.g. a photoresist film or a resin.

In order to dry the coating on the substrate, a temperature in the range of from 100° C. to 200° C. may be applied. Preferably, the coated substrate is subjected to a temperature in the range of from 150° C. to 200° C. The drying or pre-bake may be performed on a hot plate. The hot plate is heated and the substrate is placed on the hot plate for a predetermined period of time. The coated substrate is subjected to this temperature over a period of time in the range of from 1 minute to 30 minutes, preferably from 5 minutes to 20 minutes.

In an embodiment, the dried coating on the substrate is annealed at a temperature in the range of from 600° C. to 800° C. Preferably, the temperature while annealing is in the range of from 650° C. to 750° C.

In another embodiment, the heating rate while heating to achieve the anneal temperature is at least 2.000 K/min, preferably at least 2.500 K/min, more preferably at least 3.000 K/min. The most preferred heating rate is at least 3.500 K/min and above. A high heating rate ensures the formation of a crack free and highly dense coating with little stress.

The annealing of the dry coating on the substrate is performed at an elevated temperature, i.e. the anneal temperature, over a period of time in the range of from 10 seconds to 10 minutes.

When spin-coating the coating solution onto the substrate, a rotational speed of the substrate in the range of from 1.500 rpm to 2.600 rpm may be applied.

The coating after the drying of the coating, i.e. the dry coating, before being subjected to an anneal process may have a thickness of at least 400 nm, preferably of at least 600 nm. The thickness of the final coating, i.e. after the anneal step, may be at least 150 nm, preferably at least 200 nm, and most preferred at least 250 nm.

The final coating after the anneal steps may have an refractive index of at least 2. The variation of the final coating may be less than 13%. The final coating after the anneal steps may have a stress of less than 150 MPa preferably of less than 100 MPa.

The resulting coating is a zirconia film in the case, a zirconium alkoxide was used, a titania film in the case, a titanium alkoxide was used, an alumina film in the case, an aluminium alkoxide was used.

BRIEF DESCRIPTION OF THE DRAWINGS

Preferred embodiments of the method for coating a substrate according to an aspect of the invention will be described below with reference to the attached FIGURE.

In the FIGURE:

FIG. 1 shows a perspective view on an assembly for spin coating a wafer.

DESCRIPTION OF THE PREFERRED EMBODIMENTS

In a first embodiment, two solutions are prepared. A first solution is prepared by mixing 35 g propanol, 20 g polyethylene glycol 600, 45 g acetylacetone and 20 g water. A second solution is prepared by mixing 50 g decanol and 160 g zirconium tetra propoxide (70% in propanol; $ZrO_2$ content 26.47%).

Then, the first solution is added to the second solution and stirring was maintained over 5 minutes. After this intimate mixing of the first and second solutions, 165 g solvent (50%) was removed at a pressure of 150 mbar and a temperature of 80° C. The removal of the solvent takes approximately 30 minutes. The removed solvent was replaced by 165 g pentanol. The viscosity of this solution is 13.5 MPa·s. The solution thus contains 50% by weight pentanol, 15% by weight decanol, 13% by weight $ZrO_2$, 13% by weight acetylacetone and 6% by weight PEG. The remainder of 3% by weight is water and propanol. By reduction of the amount of pentanol added to the solution, the content of $ZrO_2$ in the solution may be increased up to 22% by weight.

The thus prepared coating solution may be coated onto a wafer by spin-coating. FIG. 1 shows a perspective view of an assembly used to spin-coat the coating solution onto a 300 mm wafer. The coating solution is supplied by a reservoir 1. From this reservoir 1, a flow 2 of coating solution is cast onto the wafer 3. The wafer 3 is mounted on a chuck 4. By rotating the chuck 4 in the rotation axis 6 in the rotation direction 5, the wafer 3 is rotated. By rotating the wafer 3, the coating solution is spun onto the wafer 3. The rotational speed of the wafer is 2.600 rpm.

The still liquid layer of the coating on the wafer is dried at 200° C. for 10 minutes. To dry the coating, the wafer is placed onto a hot plate at a temperature of 200° C. The thickness of the dry coating is 630 nm. Then, a very quick thermal anneal step (RTP) at 700° C. is applied. The temperature of 700° C. was achieved at a heating rate of 3.375 K/min within 12 seconds from room temperature. The wafer with the coating was maintained at this temperature for 60 seconds. The resulting coating is a crack free coating with a thickness of 257 nm. The refractive index of the annealed coating is 2.

In a second embodiment, 25 g propanol, 15 g polyethylene glycol 400, 40 g acetyl acetone and 25 g water are mixed to form a first solution. A second solution is prepared by mixing 65 g decanol and 200 g zirconium tetrapropoxide.

In an analogous way to the first embodiment, the two solutions are mixed and the solvent is removed from the mixture and replaced by pentanol. The spin-coating, drying and annealing of the layer is performed in the same manner as in the first embodiment.

In a third embodiment, a coating of $Al_2O_3$ is achieved. A fist solution is prepared by mixing 10 g isopropoxy ethanol, 12 g polyethylene glycol 600, 5.5 g water at a pH of 4 (adjusted by addition of nitric acid) and 15 g ethyl acetoacetate. The second solution contains 15 g isopropoxyethanol and 25 g aluminium sek-butoxide. After mixing the two solutions, the mixture is heated to 80° C. under reflux of the solvent. Then, the solvent is removed to obtain a solution of a concentration of $Al_2O_3$ of 10% by weight. The spin-coating, drying and annealing of the layer is performed in the same manner as in the first embodiment.

Although modifications and changes may be suggested by those skilled in the art, it is the intention of the inventor to embody within the patent warranted hereon all changes and modifications as reasonably and properly come within the scope of this contribution to the art.

The additional use of yttrium propoxide in the preparation of the second solution results in a yttrium stabilised zirconia coating on a wafer. By adjusting the concentration of the solution before coating a substrate, the thickness of the layer can be influenced.

What is claimed is:

1. A method for coating a substrate, comprising the steps of:
    providing a substrate, and a coating solution prepared by the following steps:
        providing a first solution comprising:
            a lower alcohol having a chain length of four carbon atoms or less ($C_1$-$C_4$);
            a polyethylene glycol;
            a complexing agent; and
            water;
        providing a second solution comprising:
            a higher alcohol having a chain length from eight to twenty carbon atoms ($C_8$-$C_{20}$); and
            at least one metal alkoxide, wherein the metal in said at least one metal alkoxide is selected from the group consisting of zirconium, aluminium, titanium, tantalum and yttrium;
    forming a sol-gel solution by mixing said first and second solutions and thereby hydrolyzing said at least one metal alkoxide to a metal oxide and an alcohol;
    forming a concentrated solution by removing said lower alcohol and the alcohol resulting from the hydrolysis of said at least one metal alkoxide; and
    forming a coating solution by adding a medium alcohol having a chain length from 5 to 10 carbon atoms ($C_5$-$C_{10}$) to said concentrated solution;
    spin-coating said coating solution onto said substrate to form a coated substrate;
    forming a dry coating on said substrate by subjecting said coated substrate to a drying step.

2. The method according to claim 1, wherein said substrate is a 12 inch wafer or a 12 inch silicon wafer.

3. The method according to claim 1, comprising heating said coated substrate to a temperature in the range of from 100° C. to 200° C. as said drying step.

4. The method according to claim 1, comprising heating said coated substrate over a period of time in the range of from 1 minute to 30 minutes as said drying.

5. The method according to claim 1, wherein said spin-coating is performed at a rotational speed in the range of from 1500 rpm to 2600 rpm.

6. The method according to claim 1, wherein said dry coating on said substrate has a thickness of at least 400 nm.

7. The method according to claim 1, wherein after the drying step an additional annealing is performed in order to form a coating on said substrate by said dry coating.

8. The method according to claim 7, wherein said annealing comprises heating said dry coating to a temperature in the range of from 600° C. to 800° C.

9. The method according to claim 7, wherein said annealing comprises heating said dry coating at a heating rate of at least 2000 K/min.

10. The method according to claim 7, wherein said annealing comprises heating said dry coating over a period of time in the range of from 10 seconds to 10 minutes.

11. The method according to claim 7, wherein said coating on said substrate has a refractive index of at least 2.

12. The method according to claim 7, wherein said coating on said substrate has a variation of the thickness of said coating of less than 13%.

13. The method according to claim 7, wherein said coating on said substrate has a stress of less than 150 MPa.

* * * * *